(12) United States Patent
Chen et al.

(10) Patent No.: US 7,876,071 B2
(45) Date of Patent: Jan. 25, 2011

(54) INTEGRATED BATTERY VOLTAGE SENSOR WITH HIGH VOLTAGE ISOLATION, A BATTERY VOLTAGE SENSING SYSTEM AND METHODS THEREFOR

(75) Inventors: Lei Chen, Singapore (SG); Fun Kok Chow, Singapore (SG); Kok Keong Richard Lum, Singapore (SG); Bin Zhang, Singapore (SG)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 779 days.

(21) Appl. No.: 11/763,522

(22) Filed: Jun. 15, 2007

(65) Prior Publication Data

US 2008/0309317 A1 Dec. 18, 2008

(51) Int. Cl.
- H02J 7/00 (2006.01)
- H01P 3/08 (2006.01)
- H04B 10/06 (2006.01)
- G01N 27/416 (2006.01)

(52) U.S. Cl. ......... 320/136; 320/108; 320/116; 320/132; 320/133; 324/433; 333/247; 398/202

(58) Field of Classification Search ......... 320/135, 320/136; 324/433
See application file for complete search history.

(56) References Cited

U.S. PATENT DOCUMENTS

| | | | | |
|---|---|---|---|---|
| 4,217,645 A * | 8/1980 | Barry et al. | ........... | 702/63 |
| 5,677,077 A * | 10/1997 | Faulk | ........... | 429/90 |
| 5,808,469 A | 9/1998 | Kopera | | |
| 6,094,031 A | 7/2000 | Shimane et al. | | |
| 6,166,549 A | 12/2000 | Ashtiani et al. | | |
| 6,411,097 B1 | 6/2002 | Ashtiani et al. | | |
| 6,462,510 B1 * | 10/2002 | Takada et al. | ........... | 320/116 |
| 6,472,880 B1 | 10/2002 | Kang | | |
| 6,549,014 B1 * | 4/2003 | Kutkut et al. | ........... | 324/426 |
| 7,071,698 B2 * | 7/2006 | Furukawa et al. | ........... | 324/433 |
| 2006/0164042 A1 | 7/2006 | Sim | | |
| 2007/0090802 A1 | 4/2007 | Seo | | |
| 2007/0096697 A1 | 5/2007 | Maireanu | | |
| 2007/0114973 A1 | 5/2007 | Miyamoto | | |
| 2007/0285083 A1 * | 12/2007 | Kamata | ........... | 324/120 |

OTHER PUBLICATIONS

Analog Devices "D7890 LC2MOS 8-Channel, 12-Bit Serial Data Acquisition System", 2006.
Analog Devices "SMP04* CMOS Quad Sample-and-Hold Amplifier", 1998.
Analog Devices AD585—"High Speed, Precision Sample-and-Hold Amplifier", Oct. 26, 1995.

* cited by examiner

Primary Examiner—Edward Tso
Assistant Examiner—Yalkew Fantu (57) ABSTRACT

An integrated circuit battery sensor and system thereof are provided. The battery sensor includes a voltage sensor configured to sample a voyage of a battery and a buffer in electrical communication with the voltage sensor and configured for scaling the sampled battery voltage and outputting a voltage signal proportional to the sampled battery voltage; wherein the voltage sensor is further configured for isolating the buffer from the battery. The voltage sensor includes a first capacitor coupled to a positive potential terminal of the battery and a second capacitor coupled to a negative potential terminal of the battery. The battery sensor includes a first die including a first and second input terminal configured for coupling to the positive and negative potential terminals of the battery; and a second die including the voltage sensor, wherein the first and second die are electrically isolated from each other.

13 Claims, 9 Drawing Sheets

INTEGRATED BATTERY VOLTAGE SENSOR WITH HIGH VOLTAGE ISOLATION, A BATTERY VOLTAGE SENSING SYSTEM AND METHODS THEREFOR

FIELD OF THE INVENTION

The present disclosure generally relates to battery voltage sensors and systems and more particularly, to an integrated circuit battery voltage sensor and battery voltage sensing system for sensing individual battery voltages of a battery pack with adequate high voltage isolation and minimum current drawn from the individual batteries.

BACKGROUND OF THE INVENTION

In order to commercialize electric and hybrid vehicles on a widespread basis the energy storage devices or batteries, which are the most expensive component of the vehicle, must operate reliably through the life of the vehicle. In a typical configuration, the batteries are formed from a stack of series connected electrochemical cells.

A common requirement for large stacks of electrochemical cells used in electric and hybrid vehicles, particularly in advanced applications such as lead acid Li-Ion or NiMH battery packs, is the need to measure individual or groups of cell voltages almost simultaneously. In practice, this means the measurements should be taken within a time window of a few milliseconds.

Figure 1:
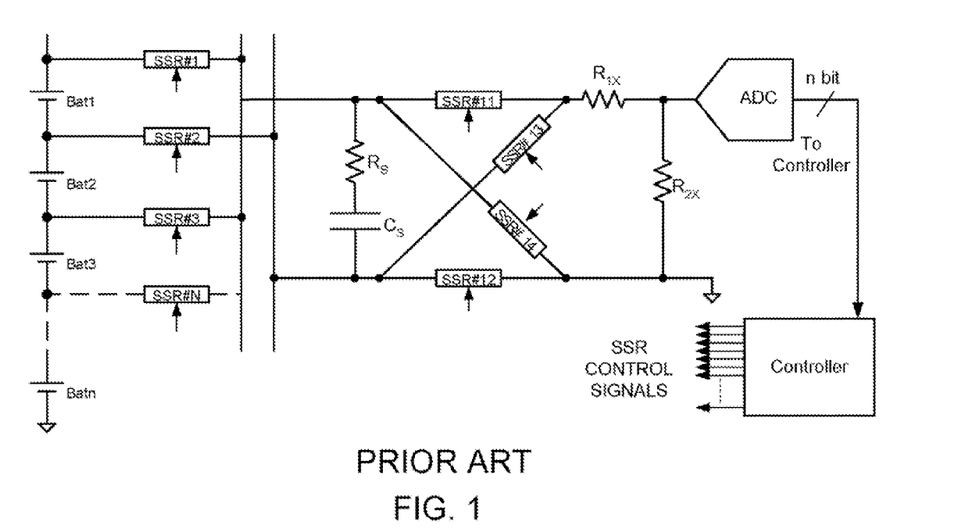
FIG. 1 is a diagram of a prior art discrete battery sensor system.

Conventionally, a flying capacitor method is used in Hybrid Electrical Vehicles for battery voltage measurement and monitoring. Referring to FIG. 1, a discrete battery sensor system employing a flying capacitor method is illustrated. As depicted in FIG. 1, an individual battery or cell Bat1-Batn of a battery pack is connected to a sensing capacitor Cs by turning on the respective Solid-State Relays (SSRs). Resistor Rs is added in series to sensing capacitor Cs to limit the transient charging current to a reasonable amount.

For example, if battery Bat1 is to be sensed, solid-state relays SSR#1 and SSR#2 will be turned on, the rest of the solid-state relays SSR#3-SSR#n will remain off and sensing capacitor Cs is then fully charged to voltage of battery Bat1. Solid-state relays SSR#1 and SSR#2 are switched off before solid-state relays SSR#11 and SSR#12 are switched on and analog-to-digital converter ADC then samples the scared version of the voltage stored at capacitor Cs through resistor divider including resistor R1X and resistor R2X. The converted digital signal representing the scaled battery voltage of battery Bat1 is then transferred to the controller for further system processing.

Solid-state relays SSR#13 and SSR#14 are used alternatively with solid-state relays SSR#11 and SSR#12 to correct the polarity inversion of the alternating batteries connected to the two common buses.

However, there are several disadvantages of the battery voltage sensing implementation shown in FIG. 1. First, in order to minimize the effect of the solid-state relays (SSRs) and parasitic leakages, the sensing capacitor Cs must be sufficiently large. A large sensing capacitor Cs means a larger amount of charge during sensing, or larger charging current if charging time to be kept constant. Secondly, a large charging current is undesirable and is likely to cause EMI problems in view of the unbalance in the charging path impedances. A transient current limiting resistor Rs is added to limit the charging current to a reasonable amount. However, together with the sensing capacitor Cs, the low pass characteristic inevitably slows down the system speed. Additionally, the system speed is further affected by the switches, which are implemented by the solid-state relays (SSRs). Solid-state relays (SSRs) are generally quite slow due to its working mechanism. Besides, "break-before-make" must be strictly observed in a sense (or sample) and hold system. Furthermore, every solid-state relay (SSR) needs a control signal, which makes this discrete solution not only have a high component count, but also very complicated in terms of wire routings.

Therefore, a need exists for techniques for sensing individual battery voltages of a battery pack within a relatively short time period. Furthermore, a need exists for an integrated battery sensor to be utilized in a battery voltage sensing system which reduces component count and system wire routings.

Various patent documents containing subject matter relating directly or indirectly to the field of the present disclosure include, but are not limited to, the following:

U.S. Pat. No. 5,808,469 to Kopera for "Battery monitor for electric vehicles," Sep. 15, 1998.

U.S. Pat. No. 6,094,031 to Shimane et al. for "Battery conditioning-detecting apparatus and battery condition-detecting unit using an optical signal," Jul. 25, 2000.

U.S. Pat. No. 6,166,549 to Ashtiani et al. for "Electronic circuit for measuring series connected electrochemical cell voltages," Dec. 26, 2000.

U.S. Pat. No. 6,411,097 to Ashtiani et al, for "Electronic circuit for measuring series connected electrochemical cell voltages," Jun. 25, 2002.

U.S. Pat. No. 6,472,880 to Kang for "Accurate voltage measurement system using relay isolated circuits," Oct. 29, 2002.

U.S. Patent Publication No. 2006/0164042 to Sim for "Apparatus and method for monitoring charging/discharging capacity of battery packs," Jul. 27, 2006.

U.S. Patent Publication No. 2007/0090802 to Seo for "Battery management system," Apr. 26, 2007.

U.S. Patent Publication No. 2007/0096697 to Maireanu for "Battery fuel gauge circuit," May 3, 2007.

U.S. Patent Publication No. 2007/0114973 to Miyamoto for "Battery voltage monitoring apparatus," May 24, 2007.

The dates of the foregoing publications may correspond to any one of priority dates, filing dates, publication dates and issue dates. Listing of the above patents and patent applications in this background section is not, and shall not be construed as, an admission by the applicants or their counsel that one more publications from the above list constitutes prior art in respect of the applicants' various embodiments.

SUMMARY

An integrated circuit battery voltage sensor and battery voltage sensing system for sensing individual battery voltages of a battery pack with adequate high voltage isolation and minimum current drawn from the individual batteries are provided.

According to one aspect of the present disclosure, a battery sensor is provided including a voltage sensor configured to sample a voltage of a battery; and a buffer in electrical communication with the voltage sensor and configured for scaling the sampled battery voltage and outputting a voltage signal proportional to the sampled battery voltage; wherein the voltage sensor is further configured for isolating the buffer from the battery. The voltage sensor includes a first capacitor coupled to a positive potential terminal of the battery and a second capacitor coupled to a negative potential terminal of the battery.

In another aspect the battery sensor further includes at least one switching device configured for coupling the voltage sensor to the battery during a sample phase and for coupling the voltage sensor to the buffer during a hold phase.

In a further aspect, the battery sensor further includes a signal generator configured to generate a first signal for controlling the at least one switching device in response to an external second signal. A first at least one switching device is coupled between the battery and voltage sensor, wherein the battery further includes at least one capacitor for isolating the signal generator from the first at least one switching device.

In one aspect, the buffer is a zero order sample and hold circuit or a sample and hold circuit with a first-order low pass filter characteristic.

In yet another aspect, the battery sensor further includes a first continuous-time filter coupled to the output of the buffer. Optionally, the battery sensor further includes a second filter coupled to an output of the first filter configured for outputting a desired frequency response of the outputted voltage signal.

According to another aspect of the present disclosure, the battery sensor further includes a cell balancing circuit configured for diverting current from the battery. In one embodiment, the signal generator is further configured to encode a current divert signal onto the first signal for controlling the cell balancing circuit. The battery sensor further a decoder coupled between the at least one capacitor and the cell balancing circuit, the decoder configured for decoding the current divert signal from the first signal.

According to a further aspect of the present disclosure, an integrated circuit for sensing a voltage of a battery includes a first die including a first input terminal configured for coupling to a positive potential terminal of the battery and a second input terminal configured for coupling to a negative potential terminal of the battery; and a second die including a voltage sensor configured to sample a voltage of the battery, the voltage sensor being in electrical communication with the first and second input terminals, wherein the first and second die are electrically isolated from each other. The voltage sensor includes a first capacitor coupled to the first input terminal and a second capacitor coupled to the second input terminal.

In another aspect, the integrated circuit further includes at least one switching device configured for coupling the voltage sensor to the first and second input terminals during a sample phase and for coupling the voltage sensor to a buffer during a hold phase. A signal generator is disposed on the second die configured to generate a first signal for controlling the at least one switching device in response to an external second signal, wherein a first at least one switching device is coupled between the first or second input terminals and the voltage sensor, and the integrated circuit further includes at least one capacitor for isolating the signal generator from the first at least one switching device. A buffer is disposed on the second die in electrical communication with the voltage sensor and configured for scaling the sampled battery voltage and outputting a voltage signal proportional to the sampled battery voltage.

In yet another aspect, the integrated circuit further includes a cell balancing circuit disposed on the first die configured for diverting current from the battery, wherein the signal generator is further configured to encode a current divert signal onto the first signal for controlling the cell balancing circuit. A decoder is disposed on the first die coupled between the at least one capacitor and the cell balancing circuit, the decoder configured for decoding the current divert signal from the first signal.

According to another aspect of the present disclosure, a system for sensing a battery is provided. The system includes a battery including at least one cell having a first positive potential terminal and a second negative potential terminal, at least one battery sensor coupled to the first and second terminals of the at least one cell, the at least one battery sensor includes a single terminal for outputting a voltage representative of a voltage sampled across the first and second terminals; an analog-to-digital converter coupled to the single terminal of the at least one battery sensor configured for outputting a digital representation of the sampled voltage; and a controller configured to receive the digital representation of the sampled voltage and for generating an enable signal for controlling a sample and hold function of the at least one battery sensor, wherein the at least one battery sensor includes a voltage sensor configured to sample a voltage of the at least one cell; and a buffer in electrical communication with the voltage sensor and configured for scaling the sampled battery voltage; wherein the voltage sensor is further configured for isolating the buffer from the at least one cell. The voltage sensor includes a first capacitor coupled to the first positive potential terminal and a second capacitor coupled to the negative potential terminal.

In another aspect, the system further includes a cell balancing circuit configured for diverting current from the at least one cell of the battery.

BRIEF DESCRIPTION OF THE DRAWINGS

These, and other aspects, features and advantages of the present disclosure will be described or become apparent from the following detailed description of the preferred embodiments, which is to be read in connection with the accompanying drawings.

In the drawings, wherein like reference numerals denote similar elements throughout the views.

It should be understood that the drawing(s) is for purposes of illustrating the concepts of the disclosure and is not necessarily the only possible configuration for illustrating the disclosure.

DETAILED DESCRIPTION OF PREFERRED EMBODIMENTS

It should be understood that the elements shown in the FIGS. may be implemented in various forms of hardware, software or combinations thereof Preferably, these elements are implemented in a combination of hardware and software on one or more appropriately programmed general-purpose devices, which may include a processor, memory and input/output interfaces.

The present description illustrates the principles of the present disclosure. It will thus be appreciated that those skilled in the art will be able to devise various arrangements that, although not explicitly described or shown herein, embody the principles of the disclosure and are included within its spirit and scope.

All examples and conditional language recited herein are intended for pedagogical purposes to aid the reader in understanding the principles of the disclosure and the concepts contributed by the inventor to furthering the art, and are to be construed as being without limitation to such specifically recited examples and conditions.

Moreover, all statements herein reciting principles, aspects, and embodiments of the disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

The functions of the various elements shown in the figures may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor ("DSP") hardware, read only memory ("ROM") for storing software, random access memory ("RAM"), and nonvolatile storage.

Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

In the claims hereof, any element expressed as a means for performing a specified function is intended to encompass any way of performing that function including, for example, a) a combination of circuit elements that performs that function or b) software in any form, including, therefore, firmware, microcode or the like, combined with appropriate circuitry for executing that software to perform the function. The disclosure as defined by such claims resides in the fact that the functionalities provided by the various recited means are combined and brought together in the manner which the claims call for. It is thus regarded that any means that can provide those functionalities are equivalent to those shown herein.

An integrated circuit battery sensor and system for sensing a plurality of battery voltages of a battery pack is provided. By utilizing modern technology and integrated circuit techniques, the sensor and system of the present disclosure are not only able to sense and output a scaled battery voltage much faster than conventional techniques, it also minimizes the number of control signals and routings needed. Furthermore, the battery sensor and system only draws a small amount of current from the battery pack.

Figure 2:
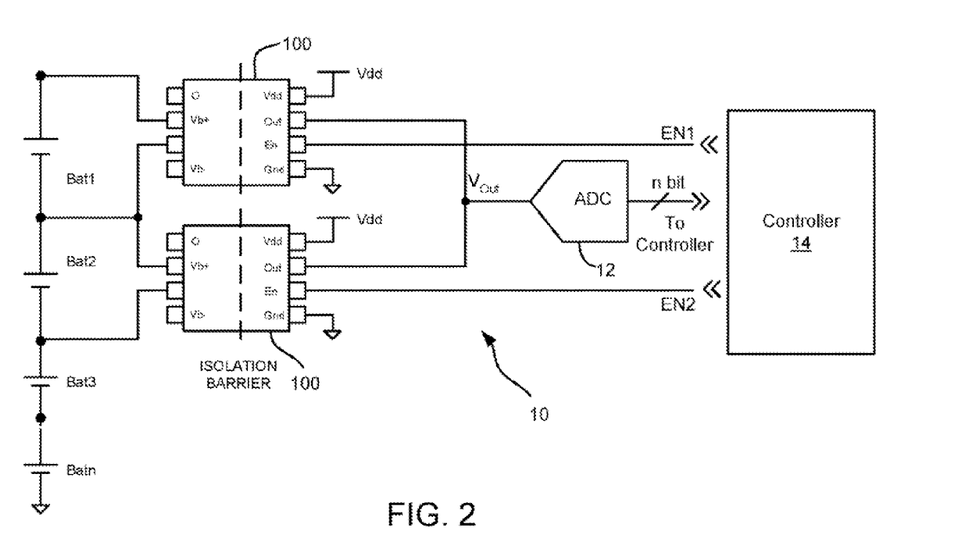
FIG. 2 is a diagram of an exemplary battery voltage sensing system in accordance with the present disclosure.

An exemplary battery voltage sensing system 10 in accordance with the present disclosure is shown in FIG. 2. The system 10 utilizes an integrated circuit battery sensor 100 where the battery sensor 100 is internally isolated, as will be described below in more detail with reference to FIG. 3. A battery voltage is sensed by the battery sensor 100 and passed through the isolation barrier, scaled and buffered by amplifiers to output a voltage representative of the battery voltage. The individual battery sensors are enabled by respective enable signals from an external controller 14. To sense the battery pack's voltage one by one only one battery sensor 100 is enabled at any time, whereas the rest of the battery sensors' outputs are tri-stated. The outputs of all the battery sensors are shorted together and feed into an analog-to-digital converter (ADC) 12. The voltage output Vout from any one battery sensor 100 is fed into an input of ADC 12 which then outputs a digital representation of the battery voltage to the controller 14 for further processing.

Figure 3:
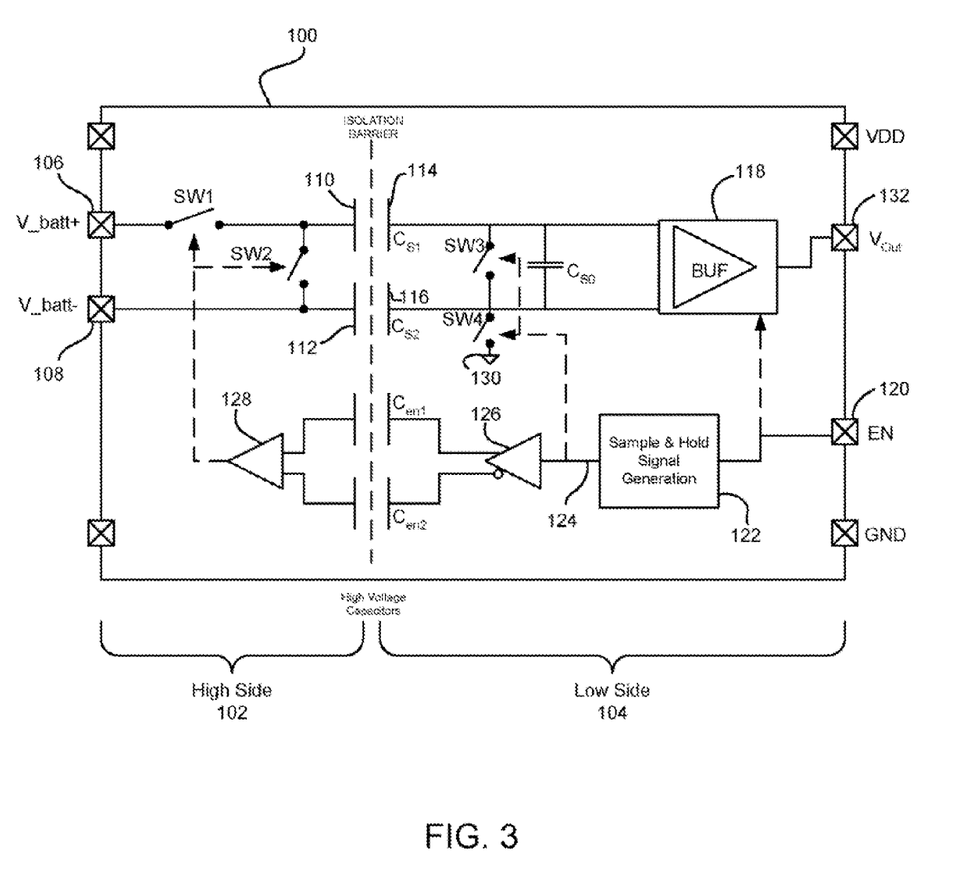
FIG. 3 is a circuit block diagram of a battery voltage sensor in accordance with an embodiment of the present disclosure.

Referring to FIG. 3, a battery voltage sensor 100 in accordance with an embodiment of the present disclosure is illustrated. The battery sensor 100 includes two separate silicon dice in a packaged chip, a High Side die 102 and a Low Side die 104. By having two separate dice in the same chip, each die 102, 104 can be internally isolated from one another. Four high voltage capacitors Cs1, Cs2, Cen1 and Cen2 are provided to pass the sensed battery voltage signals between the two isolated dice or chips 102, 104.

The battery sensor 100 includes at least two input terminals 106, 108 to be coupled to a battery that is to be sensed. Input terminal V_batt+ 106 is coupled to a positive potential terminal of a battery or cell and input terminal V_batt− 108 is coupled to a negative potential terminal of the battery or cell. Input terminal V_batt+ 106 is coupled to capacitor Cs1 and input terminal V_batt− 108 is coupled to capacitor Cs2. Since the High Side die 102 and Low Side die 104 are isolated from one another, capacitors Cs1 and Cs2, e.g., voltage sensors, will transfer the sensed voltage from one die to another.

It is to be appreciated that the high voltage isolation is achieved by the four high voltage capacitors, namely capacitors Cen1, Cen2, Cs1 and Cs2. These capacitors are implemented by using different layers of metals with adequate dielectric strength for high voltage isolation. The high voltage capacitors can be readily formed between different metal layers in modern process technology. To sustain the high voltage, the metal layers chosen must have enough space between them. Theoretically, these four capacitors can either be on the High Side die 102 or Low Side die 104, but for proper matching and immunity to high voltage common mode event, capacitors Cen1 and Cen2 should be together on the same die, while the same applies to capacitors Cs1 and Cs2. In one embodiment, due to concerns on parasitic capacitance, parasitic inductance and die areas of the two dice, capacitors Cen1 & Cen2 are located on the High Side die 102, whereas capacitors Cs1 and Cs2 are on the Low Side die 104.

Capacitor Cs0 is coupled in series to capacitors Cs1 and Cs2 to store a voltage which is a scaled battery voltage sensed by capacitors Cs1 and Cs2. The battery sensor 100 further includes a buffer 118 configured to buffer the voltage signal from capacitor Cs0. The battery sensor 100 further includes a plurality of switches SW1-SW4 for isolating capacitors Cs1 and Cs2, e.g., voltage sensors, from the battery in one phase and from the buffer in another phase, as will be described below in relation to the operation of the battery sensor 100. The switches are implemented by MOS transistors. Depending on the supply voltage and the battery voltage, high voltage transistors may be employed.

When in operation an Enable signal (EN) is received on terminal 120 from an external source, e.g., a controller of the battery sensing system. The Enable signal (EN) is translated into Sample and Hold signals by a Sample and Hold Signal Generation block 122 (e.g., a Sample and Hold Signal Generator) with some on-chip timing circuitry (not shown). Sample and hold signals can be generated by utilizing an on-chip oscillator and some standard logics, with the Enable signal from an external controller. Multiple sample and hold signals can also be generated from a single Enable signal to increase the system robustness in the event of high voltage common mode voltage changes.

The Sample and Hold signals 124 are then transferred across the isolation barrier through capacitors Cen1 and Cen2. The sample and hold signals on both High Side and Low Side dice are designed to be non-overlapping, to ensure proper sense (or Sample) and Hold function.

Block 126 is a digital driver configured to drive the sample and hold signal across the high voltage capacitors Cen1 and Cen2, whereas block 128 on the High Side die is configured to receive the transmitted signal, amplify it into a full-swing digital signal, and generate non-over-lapping sample and hold signals. Switch SW1 and switch SW2 are controlled by these signals.

Due to a significant amount of signal attenuation, driver 126 must drive the signal with an adequate voltage swing, so that receiver block 128 can receive the signal properly. If the supply on the Low Side die 104 is too low, a charge pump can be implemented to provide higher supply voltage to driver 126.

Terminals VDD and GND are for the power to the Low Side die 104, and the V_batt+ 106 and V_batt− 108 are for the power to the High Side die 102 as well as the voltage sensing terminals.

At sampling phase, the battery positive and negative voltages (Vbatt+ and Vbatt−) are sampled onto capacitors Cs1 and Cs2 respectively by closing switch SW1 and opening switch SW2, while the capacitor plates 114, 116 connected to the Low Side are shorted to a reference voltage at the Low Side by closing switch SW3 and switch SW4. The reference voltage is shown as 130, e.g., the Low Side die ground (GND) connection. For better operation and easier design, the reference voltage is practically chosen about half VDD, which can be generated from a bandgap circuit, and buffered by an amplifier with adequate driving strength. The supply voltage to the Low Side, e.g., Vdd, can range from about 1.8V to about 5.5V, and the high side supply voltage (e.g., the individual battery cell voltage) can be a low as a few hundred mV, and as high as 18V depends on the type of the battery cell.

Figure 5A:
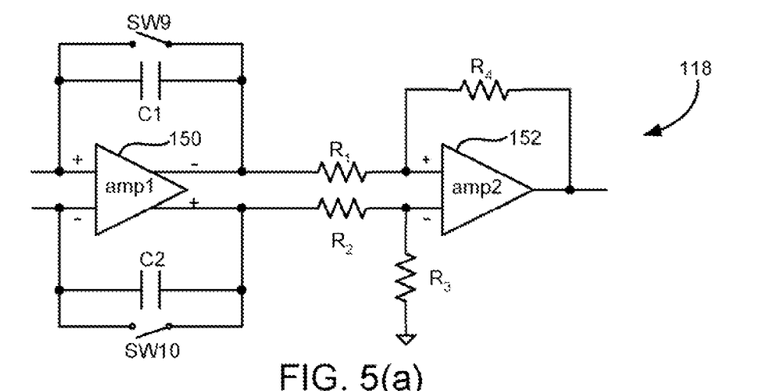
FIG. 5(a) is a diagram of an embodiment of a buffer circuit to be employed in the battery voltage sensor of the present disclosure.
Figure 5B:
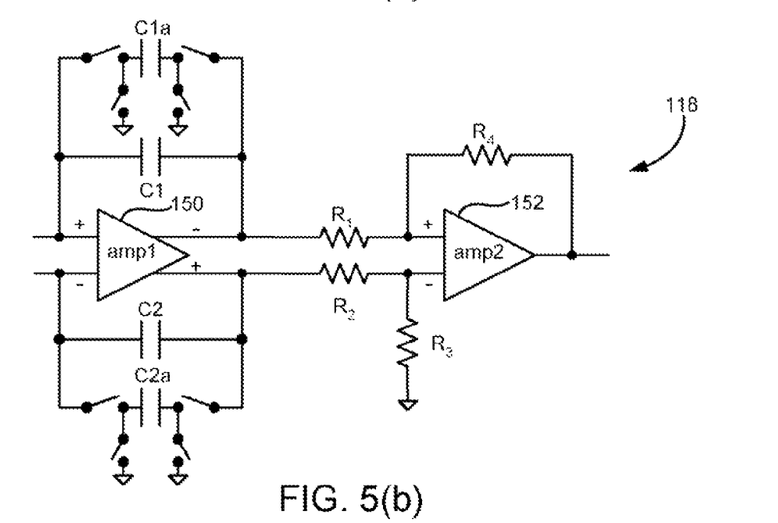
FIG. 5(b) is a diagram of an alternative embodiment of the buffer circuit for the BUF block shown in FIG. 4.
Figure 5C:
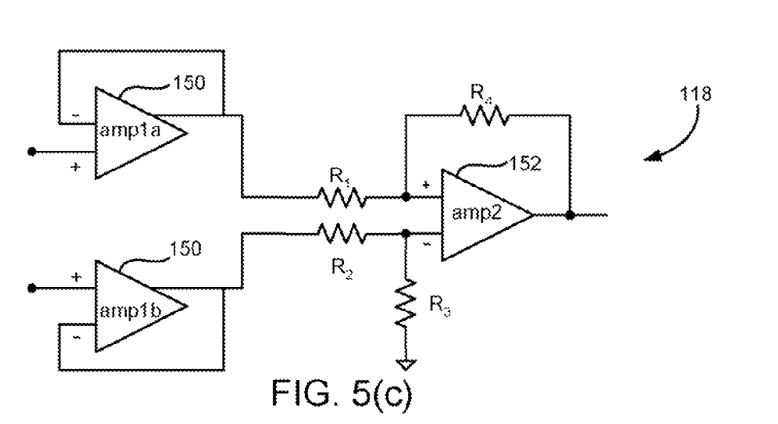
FIG. 5(c) is yet another alternative embodiment of the buffer circuit for the BUF block in shown in FIG. 3.

At the end of the sampling phase, capacitor Cs1 is disconnected from the battery by opening switch SW1. During the holding phase, switch SW2 is closed, while switches SW3 and SW4 are open, the charges stored on Cs1 and Cs2 during the sampling phase are re-distributed among Cs1, Cs2 and Cs0 according to the ratio of the capacitances. The voltage on capacitor Cs0 is then buffered by buffer 118 and outputted on terminal Vout 132, where buffer 118 can be implemented by using simple buffers as shown in FIG. 5(c) and described below. The output signal can be designed to be either differential or single-ended depending on the input requirement of the ADC 12 shown in FIG. 2. A single-ended version is shown in FIG. 3 for illustration purpose.

Figure 4:
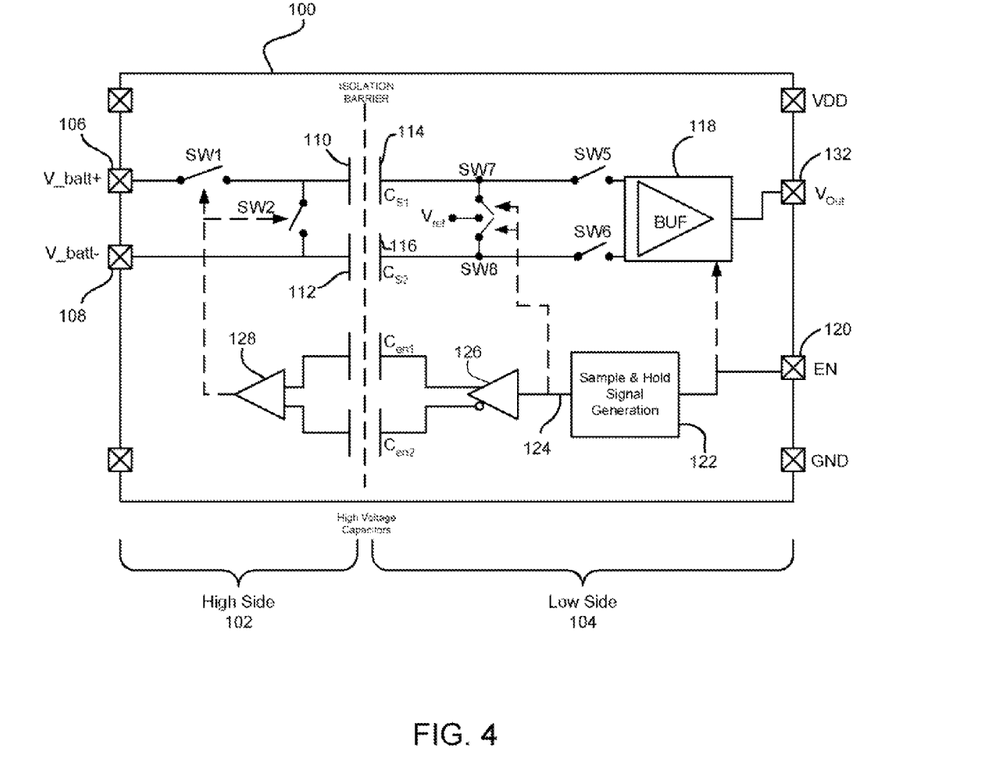
FIG. 4 is a circuit block diagram of a battery voltage sensor in accordance with another embodiment of the present disclosure.

The sampling and redistribution capacitors can be rearranged along with the buffer configurations. FIG. 4 shows another possible embodiment to sense and hold the battery voltage, with the scaling and buffering achieved by the BUF block. This architecture is more symmetrical compared to the one shown in FIG. 3. During sampling phase, switches SW1, SW7 and SW8 are closed to sample the battery voltage onto capacitors Cs1 and Cs2, while switches SW2, SW5 and SW6 are open. Switches SW9 and SW10 within the buffer block 118 are also closed to reset the capacitor C1 and C2, as shown in FIGS. 5(a) and 5(b). During the holding phase, switches SW1, SW7, SW8, SW9 and SW10 are open, whereas switches SW2, SW5 and SW6 are closed for charge transfer, voltage scaling and voltage buffering. Referring to FIG. 5(a), charges stored onto capacitors Cs1 and Cs2 during the sampling phase are transferred to capacitors C1 and C2, voltage scaling is achieved by C1/Cs1 ratio, and the voltages across capacitors C1 and C2 are held and buffered by amplifier (amp1) 150.

FIG. 5 shows three of possible implementations of the buffer circuit (BUF) 118 shown in FIG. 3 and FIG. 4. In both FIGS. 5(a) and (b), which can be used in FIG. 4, amplifier (amp1) 150 is configured to scale and hold the battery voltage, which was sampled onto capacitor Cs1 and Cs2 during the sampling phase. Amplifier (amp1) 150 is a fully differential amplifier, with proper common mode feedback. Amplifier (amp1) 150 must be stable with unity gain feedback for the configuration shown in FIG. 5(a). Amplifier (amp2) 152 is a single-end amplifier and must able to drive the off-chip load, including the ADC 12 input capacitance and resistance. Amplifier (amp2) 152 converts the differential outputs of amplifier (amp1) 150 to a single-ended output. Amplifier (amp2) 152 must also provide adequate drivability to the loads following it. For example, if the output goes directly to the terminal Vout 132, amplifier (amp2) 152 must be able to drive the off-chip loads and the parasitics. If amplifier (amp2) 152 itself can't provide adequate drivability, an additional high drive buffer amplifier can also be added to the output of amplifier (amp2) 152. FIG. 5(c) is an alternate possible implementation for the buffer circuit (BUF) 118 shown in FIG. 3, including amplifiers amp1a, amp1b and amp2 being configured similar to the amplifiers as described above for FIGS. 5(a) and 5(b).

The implementation in FIG. 5(a), with the sampling capacitor Cs1, Cs2 and the respective switches, form a zero order sample and hold circuit. During the sampling phase, the battery voltage is sampled onto capacitors Cs1 and Cs2, whereas capacitors C1 and C2 connected around amplifier (amp1) 150 are reset by closing switches SW9 and SW10. In the hold phase, switches SW9 and SW10 are open, the sampled charges are transferred to capacitors C1 and C2 and the corresponding voltages are held at the outputs of amplifier (amp1) 150. Switches SW9 and SW10 are controlled by the sample and hold signals generated by block 122.

With the additional capacitors C1a, C1b and corresponding switches FIG. 5(b) shows a sample and hold circuit with a first-order low pass filter characteristic. During a high voltage common mode event between the High Side and Low Side, the Enable signal from the Low Side to High Side, or the sampled battery voltages from High Side to Low Side could be corrupted thus a one-shot sample-and-hold system is not robust enough. With the first-order low pass filter characteristic, the battery voltages can be sampled and held for many consecutive times, the held voltages at amplifier (amp1) 150 outputs will be the average of the sampled battery voltages.

It is to be appreciated that capacitors C1, C2, C1a and C2a can be Poly-Insulator-Poly (PIP) or Metal-Insulator-Metal (MIM) capacitors, wherein trimming may be required in order for them to match capacitors Cs1 and Cs2. High voltage capacitors, similar to the type used for capacitors Cs1 and Cs2, can also be used for better matching if silicon area is not a concern. Furthermore, the resistors $R_1$-$R_4$ can be poly resistors or any other type of integrated resistor with suitable characteristics known in the art.

A continuous-time filter may optionally be added to the battery sensing system 10 for better accuracy and robustness. The filter will filter out the glitches due to the nature of the prior switched capacitor circuit formed by amplifier (amp1) 150 of the buffer 118 as shown in FIG. 5. The continuous-time filter may be an on-chip active filter, an off-chip active filter, an off-chip passive filter or any combination thereof.

Figure 6:
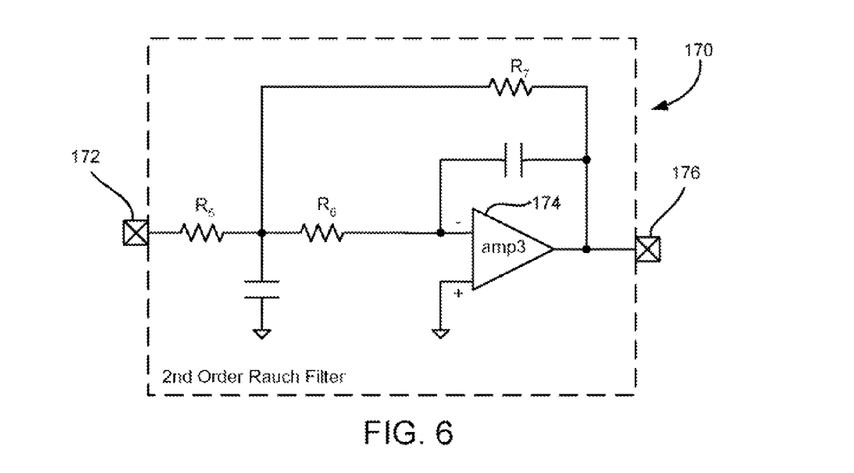
FIG. 6 is a diagram of a filter circuit to be employed in the battery voltage sensor of the present disclosure.
Figure 7:
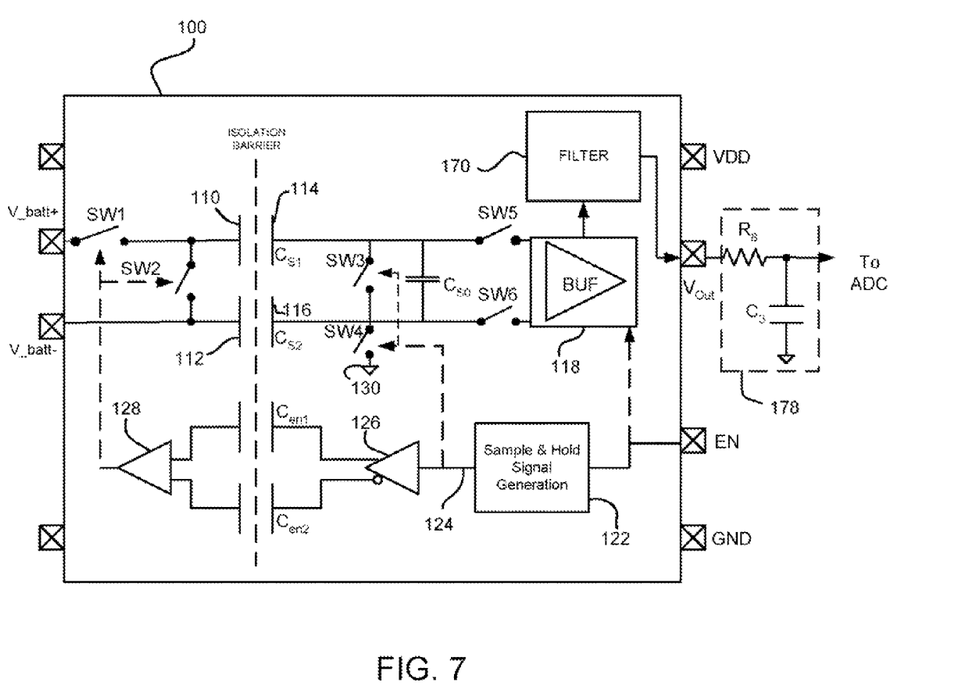
FIG. 7 is a diagram of an exemplary battery voltage sensor including an off-chip RC filter and on-chip active filter in accordance with an embodiment of the present disclosure.

FIG. 6 illustrates one possible implementation of an on-chip active filter 170. Terminal 172 of filter 170 is coupled to the output of amplifier (amp2) 152 of buffer 118 or output terminal Vout 132. The output 176 of amplifier (amp3) 174 is then the output voltage for the battery sensor 100. A simple RC filter 178 can also be connected to the output of amplifier (amp3) 174 and, with careful placement of the filter poles, desired frequency response such as Butterworth or Chebyshev filter responses can be achieved as shown in FIG. 7. A Butterworth response guarantees maximally flat passband characteristic and a Chebyshev response achieves better stop band attenuation. This simple RC filter 178 and the on-chip $2^{nd}$ order Rauch filter 170 is an example of an on-chip/off-chip, active/passive filter implementation.

As described above, the integrated battery sensor of the present disclosure can be utilized in battery measurement and monitoring, for example, in hybrid electrical vehicle. Referring back to FIG. 2, the system 10 utilizes a single integrated circuit battery sensor 100 for each cell, e.g., Bat1, Bat2, . . . Batn, of a battery pack. The battery voltage of each cell is sensed by the battery sensor 100 and passed through the isolation barrier, scaled and buffered by amplifiers to output a voltage representative of the battery voltage, e.g., Vout. The individual battery sensors 100 are enabled by respective enable signals from a controller 14. To sense the individual battery cell voltages one by one, only one battery sensor 100 is enabled at any time, whereas the rest of the battery sensors' outputs are tri-stated. For example, if an individual battery sensor 100 is not enabled the output is disconnected from the rest of the circuit, putting the output in a high impedance state. The intent of this state is to allow multiple circuits, i.e., battery sensors 100, to share the same output line without affecting each other. The outputs of all the battery sensors are shorted together and feed into an analog-to-digital converter (ADC) 12. The voltage output Vout from any one battery sensor 100 is fed into an input of ADC 12 which then outputs a digital representation of the battery voltage to the controller 14 for further processing.

For optimal charging and operation, all battery cells within a battery pack are to be at the same voltage level. From a system's point of view, cell balancing is needed to achieve the optimal conditions. Cell balancing can be understood as the following. First, the system controller 14 gathers the battery cell voltage information through the battery sensor 100. The system controller 14 then compares the cell voltage with other cells' voltages, if this cell voltage is higher than other cells, the system controller 14 can decide to issue a command to divert the current. The diverting of current can be further classified into two different categories, namely, current shunting and current dissipation. For certain applications, when a battery pack is to be fully charged during a charging phase, current shunting is used for cell balancing. For some other applications, such as in Hybrid Electric Vehicles, when the battery pack is preferred to operate at medium charged condition, current dissipation is preferred. This cell balancing function can be integrated with the battery sensor 100 on the High Side die 102 as shown in FIG. 8. In this embodiment, the battery sensor 100 includes resistor R9 and transistor NM1, as the cell balancing circuit. The gate of NM1 is controlled by a decoded divert command signal, as will be described below.

Figure 9A:
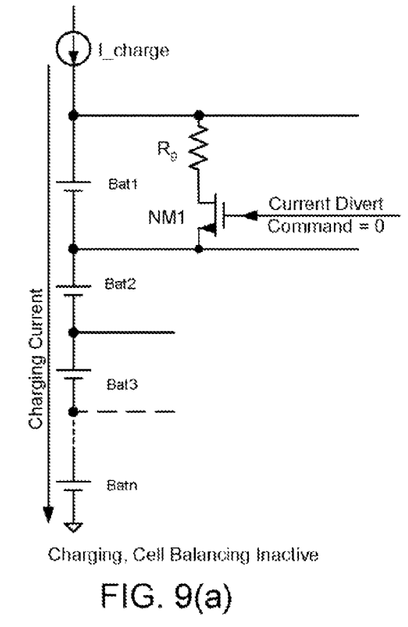
FIGS. 9(a)-(d) illustrate current shunting and current dissipation of cell balancing.
Figure 9B:
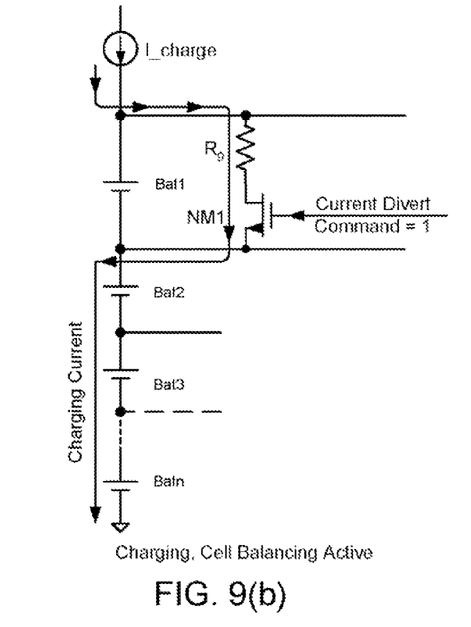

As illustrated in FIG. 9(a), when the divert signal going into switch or transistor NM1 gate is low, e.g., current divert command=0, switch NM1 is open and all the charging current flows through every battery cell to charge them up. Every type of battery cell has a maximum safe charging voltage, Vbmax. For example, the maximum safe charging voltage is 4.2V for a Lithium-Ion battery. Assuming battery cell Bat1 is charged to 4.2V, to prevent battery cell Bat1 from furthering charging above 4.2V, a divert command is issued by the system controller to turn on switch NM1. As illustrated in FIG. 9(b), with switch NM1 turned on, and the assumption of $R_{dsNM1}$=0, R9=Vbmax/I_charge, the full amount of current I_charge will be flowing through resistor R9 and switch NM1. In another words, no charging current will flow through battery cell Bat1, thus battery cell Bat1 is not further charged.

Figure 9C:
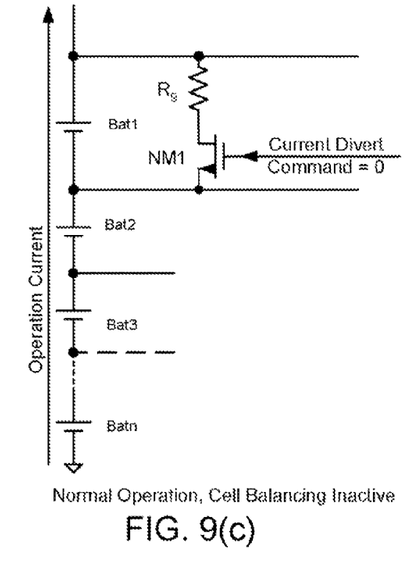
Figure 9D:
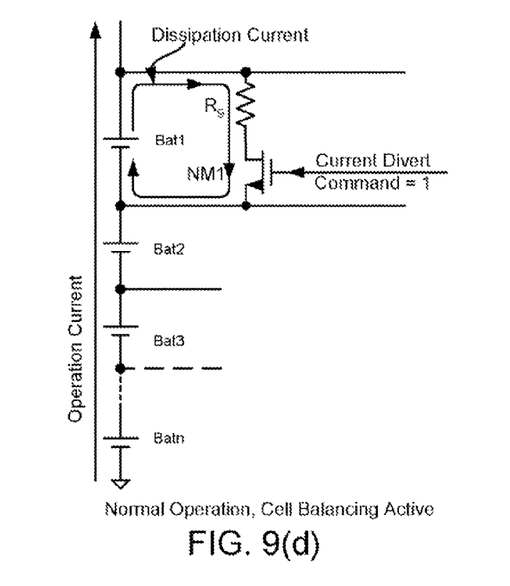

Current dissipation is configured a little bit differently with R9>>Vbmax/I_charge. During normal operation, when the system controller determines a certain cell has a higher voltage, the controller can decide to issue a divert command to turn on the corresponding switch NM1, so that a small amount of current (=Vbat/R9) is dissipated through resistor R9, and the high battery cell voltage is slowly balanced to other cells, as shown in FIG. (d). Otherwise, the current divert command will go low and the battery cells will operate in their normal condition, as shown in FIG. 9(c).

Figure 8A:
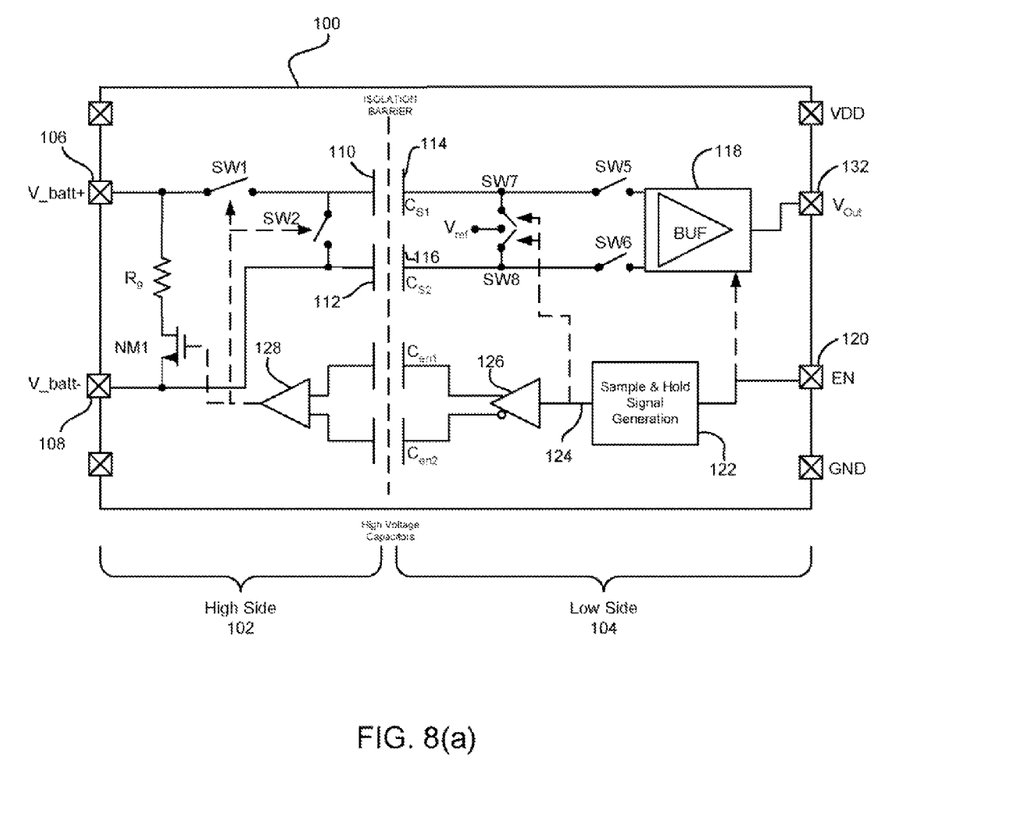
FIG. 8(a) is a diagram of an exemplary battery voltage sensor including a cell balancing circuit in accordance with an embodiment of the present disclosure and FIGS. 8(b)-8(c) are exemplary alternative embodiments of cell balancing configurations.
Figure 8B:
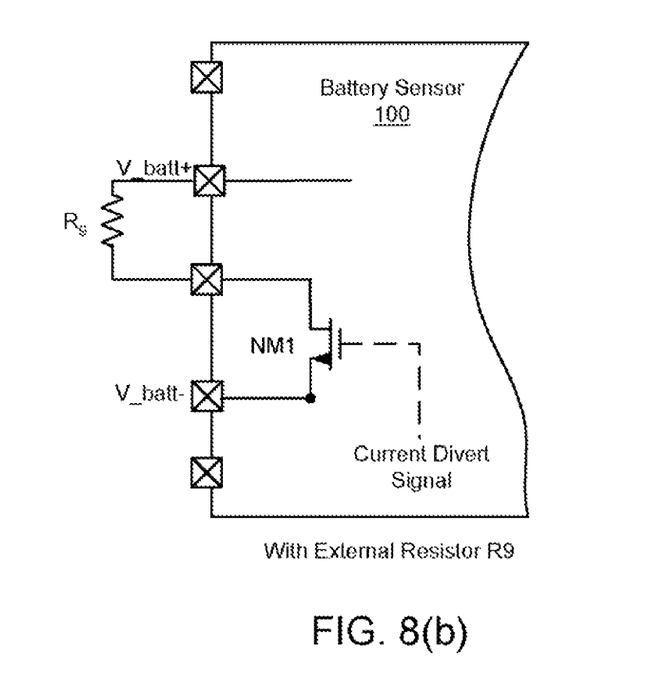
Figure 8C:
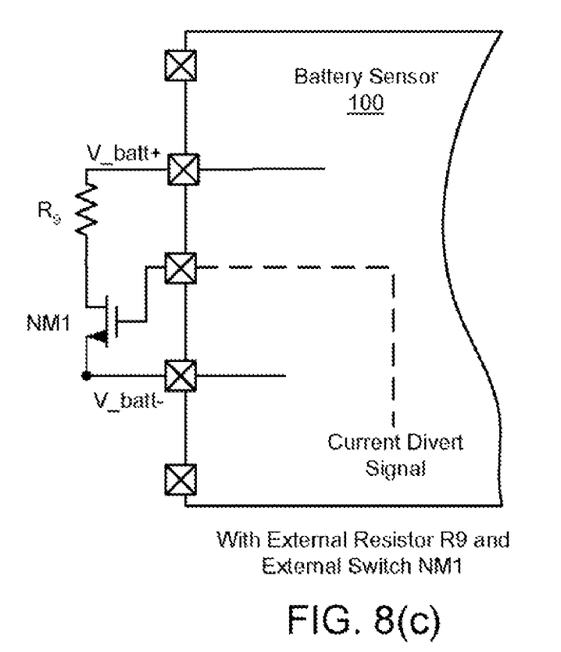

As described above, this cell balancing function can be integrated with the battery sensor 100 on the High Side die 102 as shown in FIG. 8(a). Depending on the system requirements, either of the cell balancing components, switch NM1 and resistor R9, can be on-chip or off-chip. FIGS. 8(b)-8(c) show different configurations of the cell balancing components or circuit. Transistor NM1 can be chosen for larger current capability when it is off-chip, its gate is driven by the divert signal from the battery sensor 100. In the case of transistor NM1 being a large MOS switch, a gate driver can be built on-chip of the battery sensor 100 for adequate drivability. With resistor R9 off-chip, different maximum cell voltages can be determined by choosing different resistor R9 values accordingly.

Figure 10A:
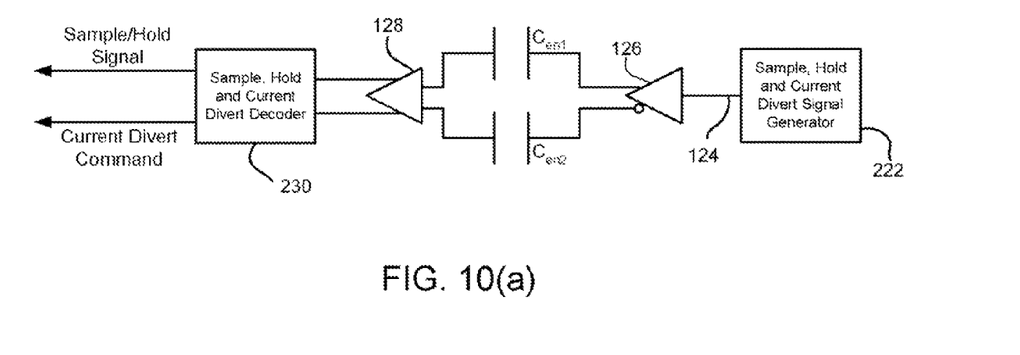
FIG. 10(a) is a block diagram of sample, hold and cell balancing circuitry in accordance with an embodiment of the present disclosure.
Figure 10B:
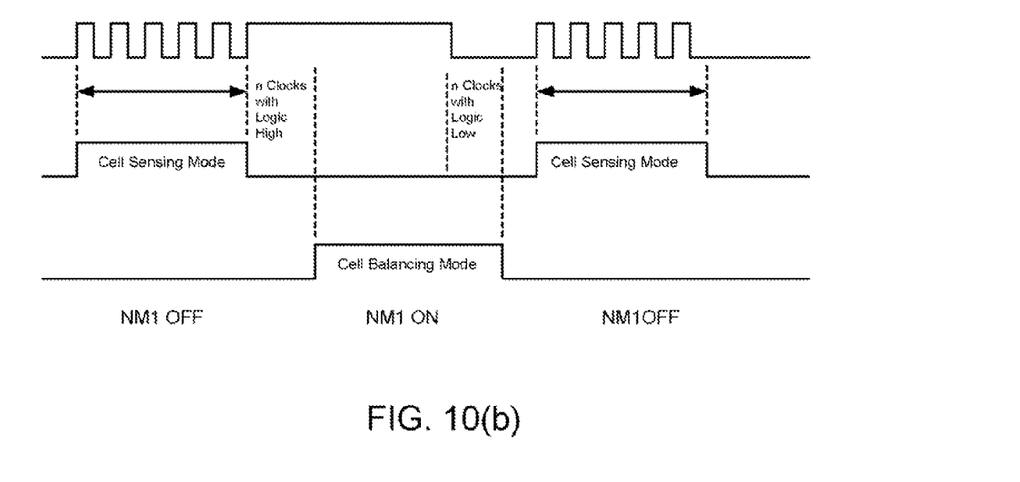
FIG. 10(b) is a timing diagram of a sample, hold and cell balancing current divert command coding scheme in accordance with an embodiment of the present disclosure.

The current divert command can be encoded with the Enable signal, passed through the high voltage isolation barrier through capacitors Cen1 and Cen2, and decoded at the High Side die. The current divert command can be transmitted from the Low Side die to the High Side die without any encoding, but two extra high voltage capacitors similar to capacitors Cen1 and Cen2 would be needed. Thus, it is desirable to encode the current divert command with the Enable signal or the generated Sample and Hold signal, which can be coupled to the High Side through capacitors Cen1 and Cen2. FIG. 10(a) shows a block diagram of the encoding circuitry and FIG. 10(b) shows a possible encoding scheme for the signal. In normal voltage cell sensing mode, the generated Sample and Hold signal is transmitted across capacitors Cen1 and Cen2 as pulses as described above.

When a current divert command is issued by the system controller 14 the Sample, Hold and Current Divert Signal Generator 222 generates a high signal, which is to be coupled to the High Side through capacitors Cen1 and Cen2. The decoder 230 decodes this high level with reference to a local clock, realized by on-chip oscillator (not shown) which is matched to the on-chip oscillator at the Low Side (not shown). If the signal is kept high for a number of cycles, e.g., n cycles, the chip enters cell balancing mode, where transistor NM1 is turned on. To turn off NM1 and stop the cell balancing mode, the Sample, Hold and Current Divert Signal Generator 222 passes a low level across capacitors Cen1 and Cen2, the decoder 230 again decodes the low level with reference to local clock, if it is kept low for n cycles, the chip gets out of cell balancing mode and enters normal voltage cell sensing mode.

Although the embodiments which incorporate the teachings of the present disclosure have been shown and described in detail herein, those skilled in the art can readily devise many other varied embodiments that still incorporate these teachings. Having described preferred embodiments for an integrated circuit battery voltage sensor and battery voltage sensing system for sensing individual battery voltages of a battery pack (which are intended to be illustrative and not limiting), it is noted that modifications and variations can be made by persons skilled in the art in light of the above teachings. It is therefore to be understood that changes may be made in the particular embodiments of the disclosure disclosed which are within the scope and spirit of the disclosure as outlined by the appended claims. Having thus described the disclosure with the details and particularity required by the patent laws, what is claimed and desired protected by Letters Patent is set forth in the appended claims.

What is claimed is:

1. An integrated circuit for sensing a voltage of at least one battery, comprising:
   (a) a first circuit comprising a first switching device, a receiver and first and second input terminals configured to be operatively coupled to a positive terminal and a negative terminal of the battery, respectively, by the first switching device;
   (b) a second circuit comprising a buffer configured to provide an output voltage signal representative of the sampled battery voltage, a sample and hold signal generator, and a digital driver, and
   (c) an isolation barrier disposed between the first circuit and the second circuit and comprising first, second, third and fourth capacitors;
   wherein the first input terminal is switchably coupled to the first capacitor through the first switching device and the second input terminal is coupled to the second capacitor, the first switching device is configured to couple the first circuit to the first and second input terminals during a sample phase to sense the voltage of the battery and to couple the first circuit to the buffer during a hold phase, the second circuit is configured to receive the sensed voltage from the first and second capacitors during the hold phase and present a scaled version of the sensed voltage to the buffer, the sample and hold generator is operatively coupled to the buffer, the timing and operation of the buffer with respect to receiving the scaled version of the sensed voltage during the hold phase is controlled by the sample and hold signal generator, the sample and hold signal generator is further configured to provide at least a first sample and hold signal through the digital driver, the third and fourth capacitors, and the receiver to the first switch to control the timing of the operation of the first switch with respect to the sample phase and the hold phase, the sample and hold generator is further configured to receive an enable signal from an external source, the enable signal being translated by the sample and hold generator into the first sample and hold signal.

2. The integrated circuit of claim 1, wherein the buffer is a zero order sample and hold circuit.

3. The integrated circuit of claim 1, wherein the buffer is a sample and hold circuit with a first-order low pass filter characteristic.

4. The integrated circuit of claim 1, further comprising a first continuous-time filter coupled to the output of the buffer.

5. The integrated circuit of claim 4, further comprising a second filter coupled to an output of the first filter configured for outputting a desired frequency response of the output voltage signal.

6. The integrated circuit of claim 1, further comprising a cell balancing circuit configured for diverting current from the battery.

7. The integrated circuit of claim 6, wherein the sample and hold generator is further configured to provide a current divert signal to control the cell balancing circuit.

8. The integrated circuit of claim 7, further comprising a decoder coupled between the first capacitor and the cell balancing circuit, the decoder being configured to decode the current divert signal from the first signal.

9. The integrated circuit of claim 1, wherein the first circuit is disposed on a first die.

10. The integrated circuit of claim 9, wherein the second circuit is disposed on a second die.

11. The integrated circuit of claim 10, wherein the first and second dice are electrically isolated from one other by the isolation barrier.

12. The integrated circuit of claim 1, wherein an analog-to-digital converter is coupled to the output of the buffer and is configured to output a digital representation of the sampled voltage therefrom.

13. The integrated circuit of claim 12, further comprising a controller configured to receive the digital representation of the sampled voltage and to generate the enable signal.

* * * * *